United States Patent
Jeon

(10) Patent No.: US 8,493,798 B2
(45) Date of Patent: Jul. 23, 2013

(54) APPARATUS AND METHOD FOR OUTPUTTING DATA IN SEMICONDUCTOR INTEGRATED CIRCUIT

(75) Inventor: Byung-Deuk Jeon, Ichon (KR)

(73) Assignee: SK hynix Inc. (KR)

( * ) Notice: Subject to any disclaimer, the term of this patent is extended or adjusted under 35 U.S.C. 154(b) by 632 days.

(21) Appl. No.: 12/346,954

(22) Filed: Dec. 31, 2008

(65) Prior Publication Data

US 2009/0257286 A1 Oct. 15, 2009

(30) Foreign Application Priority Data

Apr. 10, 2008 (KR) .................. 10-2008-0033315

(51) Int. Cl.
*G11C 7/10* (2006.01)
(52) U.S. Cl.
USPC .................................... 365/189.05
(58) Field of Classification Search
USPC ...................... 327/161; 365/189.05
See application file for complete search history.

(56) References Cited

U.S. PATENT DOCUMENTS

| 6,789,209 | B1 | 9/2004 | Suzuki et al. |
| 7,759,990 | B2 * | 7/2010 | Miike ............... 327/147 |
| 2002/0039323 | A1 | 4/2002 | Tokutome et al. |
| 2004/0008064 | A1 | 1/2004 | Kashiwazaki |
| 2004/0008069 | A1 * | 1/2004 | Welker et al. ............ 327/278 |
| 2006/0077725 | A1 * | 4/2006 | Lee ................. 365/189.05 |
| 2008/0303574 | A1 * | 12/2008 | Lee .................... 327/263 |
| 2010/0201417 | A1 * | 8/2010 | Wakayama ............... 327/161 |

FOREIGN PATENT DOCUMENTS

KR 1020010004250 A 1/2001

* cited by examiner

*Primary Examiner* — Hoai V Ho
*Assistant Examiner* — Min Huang
(74) *Attorney, Agent, or Firm* — Baker & McKenzie LLP

(57) ABSTRACT

An apparatus for outputting data in a semiconductor integrated circuit includes a clock generation block configured to activate a first clock signal for outputting a data signal and a second clock signal for outputting a data strobe signal based on a predetermined timing, and a data output block configured to latch a pre-data signal and a pre-data strobe signal in response to the first clock signal and the second clock signal, respectively.

7 Claims, 3 Drawing Sheets

APPARATUS AND METHOD FOR OUTPUTTING DATA IN SEMICONDUCTOR INTEGRATED CIRCUIT

CROSS-REFERENCES TO RELATED APPLICATION

The present application claims priority under 35 U.S.C. §119(a) to Korean application number 10-2008-0033315, filed on Apr. 10, 2008, in the Korean Intellectual Property Office, which is incorporated herein by reference in its entirety as if set forth in full.

BACKGROUND

1. Technical Field

The embodiments described herein relate to a semiconductor integrated circuit (IC), and more particularly, to a apparatus and a method for outputting data in a semiconductor IC.

2. Related Art

In general, a semiconductor IC includes an apparatus to output a data signal 'DQ' and a data strobe signal 'DQS' indicative of timing for reading the data signal 'DQ' from an exterior of the semiconductor IC in response to a read command.

FIG. 1 is a schematic block diagram of a conventional data output apparatus of a semiconductor IC. In FIG. 1, the data output apparatus 10 includes latches 1 and 2 and drivers 3 and 4. A pre-data signal 'PRE_DQ' is latched by the latch 1 in response to a clock signal 'CLKDO' and is output as a data signal 'DQ' through the driver 3. In addition, a pre-data strobe signal 'PRE_DQS' is latched by the latch 2 in response to the clock signal 'CLKDO' and is output as a data strobe signal 'DQS' through the driver 4. The clock signal 'CLKDO' is a signal generated using a delay locked loop clock signal 'DLLCLK' during the activation interval of an output enable signal 'OUTEN'.

FIG. 2 is a timing diagram illustrating the operation of the conventional data output apparatus of In FIG. 1. As can be seen, the output timing of the data signal 'DQ' and the data strobe signal 'DQS' is commonly determined by the clock signal 'CLKDO'. The potential of a pad connected with the data signal 'DQ' according to termination operation is set to a termination voltage level 'VTT', i.e., to one-half of a power voltage level 'VDDQ/2'.

In FIG. 2, the data signal 'DQ' transitions to a high level, i.e., 'VDDQ', or to a low level, i.e., 'VSSQ', from the termination level 'VTT'. The potential of a pad connected with the data strobe signal 'DQS' is also set to the termination level 'VTT'. Conversely, the data strobe signal 'DQS' transitions from a ground voltage level 'VSSQ' according to the preamble standards for semiconductor ICs. The preamble standards are defined to ensure that the data strobe signal 'DQS' is maintained at the ground voltage level 'VSSQ' for a time corresponding to one clock signal 'CLK' before the data strobe signal 'DQS' is initially generated.

As described above, although the data signal 'DQ' and the data strobe signal 'DQS' start to transition with the same clock signal 'CLKDO', the times required for the data signal 'DQ' and the data strobe signal 'DQS' to reach the termination level 'VTT' are different from each other due to the starting levels of the data signal 'DQ' and the data strobe signal 'DQS', which are different from each other. Thus, the data signal 'DQ' and the data strobe signal 'DQS' have a time difference to reach the termination level 'VTT'. As the time difference becomes shorter, it is advantageous for the normal operation of the semiconductor IC. Although it is preferable that there is no time difference, in an actual circuit, the time difference is likely to deviate by a predefined specification 'tLZ'.

If the mismatch between the data signal 'DQ' and the data strobe signal 'DQS' increases, i.e., as the time difference between the data signal 'DQ' and the data strobe signal 'DQS' deviates the predefined specification 'tLZ', an external system may not precisely recognize the data output from the semiconductor IC, thereby creating problems.

SUMMARY

An apparatus and a method to output data in a semiconductor IC capable of minimizing a time difference between a data signal and a data strobe signal is described herein.

In one aspect, an apparatus for outputting data in a semiconductor integrated circuit includes a clock generation block configured to activate a first clock signal for outputting a data signal and a second clock signal for outputting a data strobe signal based on a predetermined timing, and a data output block configured to latch a pre-data signal and a pre-data strobe signal in response to the first clock signal and the second clock signal, respectively.

In another aspect, a method for outputting data in a semiconductor integrated circuit includes the steps of activating a first clock signal for outputting a data signal and a second clock signal for outputting a data strobe signal with a predetermined time difference, and outputting the data signal by latching a pre-data signal in response to the first clock signal and the data strobe signal by latching a pre-data strobe signal in response to the second clock signal.

In another aspect, an apparatus for outputting data in a semiconductor integrated circuit includes a control signal generation section configured to determine an activation interval of a control signal according to a set signal and a reset signal, the set signal generated in response to activation of an output enable signal, a reset signal generation section configured to output a delay locked loop clock signal as the reset signal, the delay locked loop clock signal corresponding to an activation interval of the output enable signal, and a clock output section configured to output a second clock signal by inverting the reset signal, and to output a first clock signal by inverting the reset signal in response to the control signal, a plurality of latches configured to latch a pre-data signal in response to the first clock signal and the second clock signal, and to output a data signal and a data strobe signal having a predetermined time difference.

These and other features, aspects, and embodiments are described in detailed below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
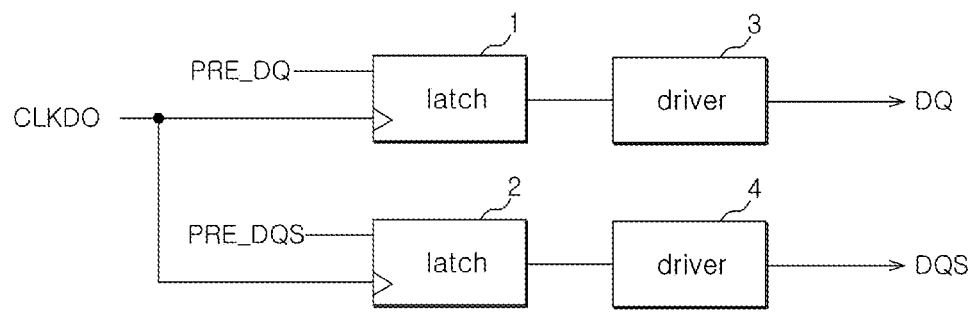
FIG. 1 is a schematic block diagram of a conventional data output apparatus of a semiconductor IC.
Figure 2:
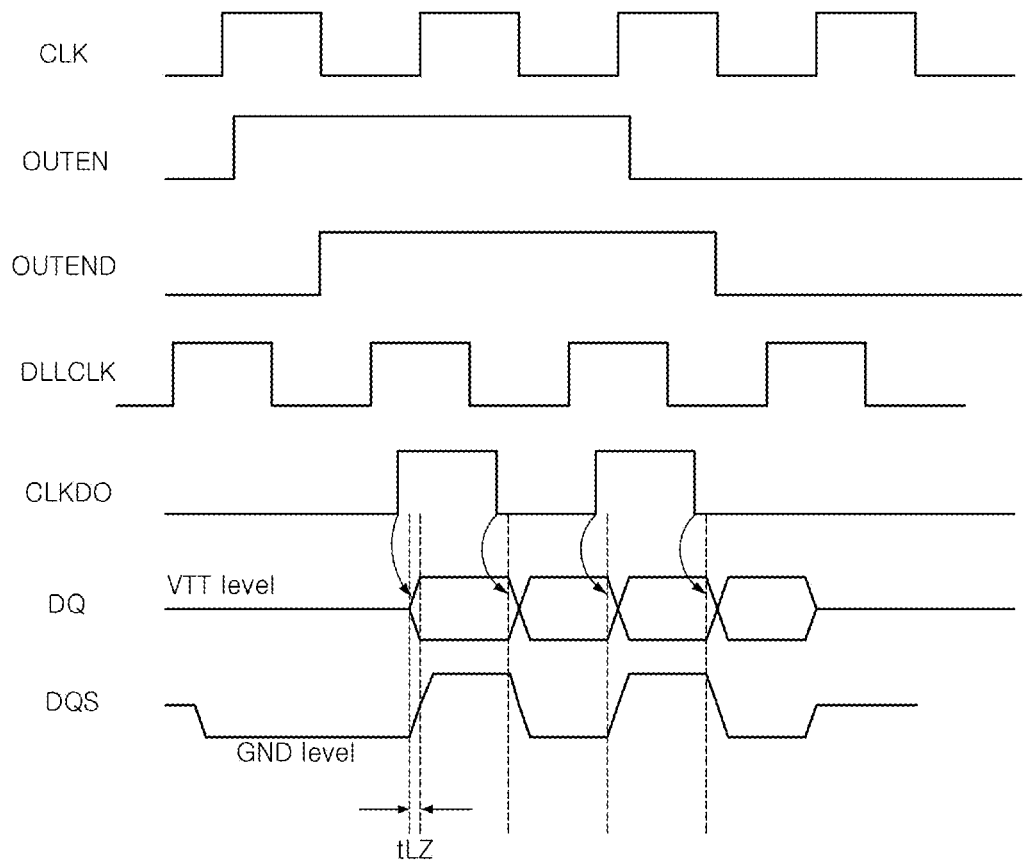
FIG. 2 is a timing diagram of the conventional data output apparatus of a semiconductor IC.
Figure 3:
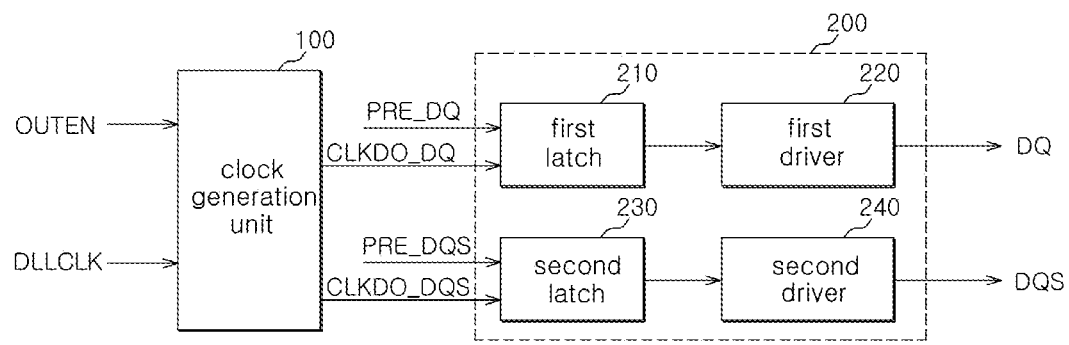
FIG. 3 is a schematic block diagram of an exemplary data output apparatus of a semiconductor IC according to one embodiment.

FIG. 3 is a schematic block diagram of an exemplary data output apparatus 50 of a semiconductor IC according to one embodiment. In FIG. 3, the data output apparatus 50 of a semiconductor IC can be configured to include a clock generation block 100 and a data output block 200.

The clock generation block 100 can be configured to generate a first clock signal, i.e., a data clock signal 'CLKDO_DQ' and a second clock signal, i.e., a data strobe clock signal 'CLKDO_DQS' using an output enable signal 'OUTEN' and a delay locked loop clock signal 'DLLCLK', such that a data signal 'DQ' and a data strobe signal 'DQS' can have substantially the same transition timing.

The data output block 200 can include first and second latches 210 and 230, and first and second drivers 220 and 240. Accordingly, the data output block 200 can latch and drive a pre-data signal 'PRE_DQ' in response to the data clock signal 'CLKDO_DQ', and can output the data signal 'DQ'. In addition, the data output block 200 can latch and drive a pre-data strobe signal 'PRE_DQS' in response to the data strobe clock signal 'CLKDO_DQS', and can output the data strobe signal 'DQS'.

Figure 4:
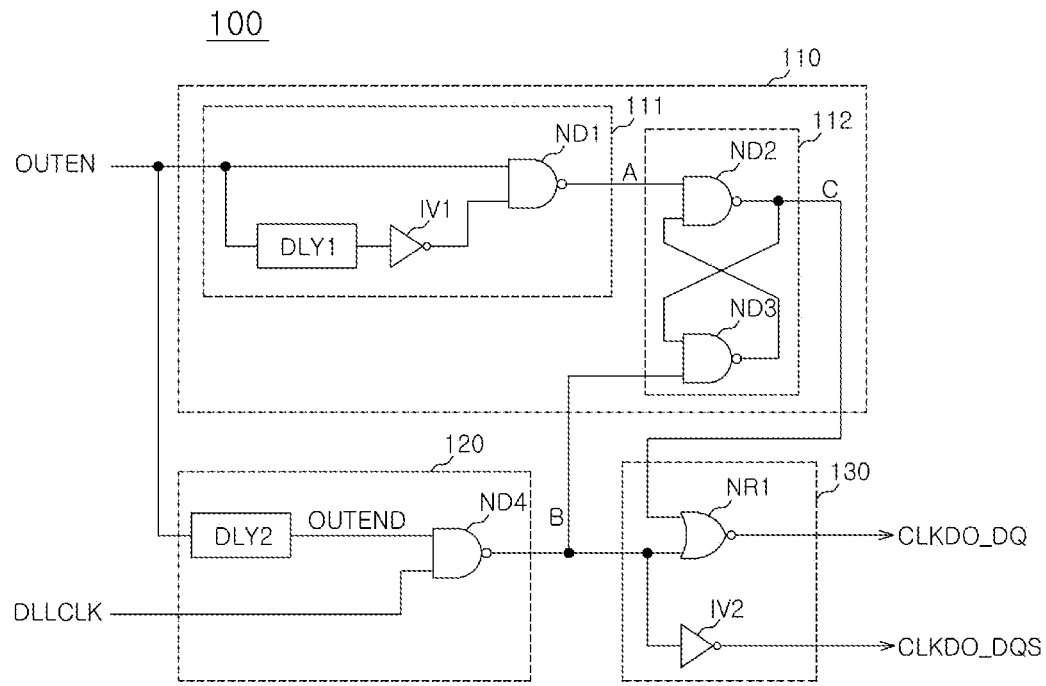
FIG. 4 is a schematic circuit diagram of an exemplary clock generation block capable of being implemented in the apparatus of FIG. 3 according to one embodiment.

FIG. 4 is a schematic circuit diagram of an exemplary clock generation block 100 capable of being implemented in the apparatus 50 of FIG. 3 according to one embodiment. In FIG. 4, the clock generation block 100 can be configured to include a control signal generation section 110, a reset signal generation section 120, and a clock output section 130.

The control signal generation section 110 can include a pulse generation unit 111 and a flip-flop 112. Here, the pulse generation unit 111 can include a first delay element DLY1, a first inverter IV1, and a first NAND gate ND1. In addition, the flip-flop 112 can include second and third NAND gates ND2 and ND3.

The control signal generation section 110 can determine the activation interval of a control signal 'C' output from the flip-flop 112 in response to a pulse signal. For example, a set signal 'A' can be generated in the pulse generation unit 111 when the output enable signal 'OUTEN' is activated and in response to a reset signal 'B'.

The reset signal generation section 120 can include a second delay element DLY2 and a fourth NAND gate ND4. The reset signal generation section 120 can output the delay locked loop clock signal 'DLLCLK', which corresponds to the activation interval of a delayed output enable signal 'OUTEND' generated by delaying the output enable signal 'OUTEN', as the reset signal 'B'.

The clock output section 130 can include a first NOR gate NR1 and a second inverter IV2. The clock output section 130 can output a signal obtained by inverting the reset signal 'B' in response to the inactivation of the control signal 'C' as the data clock signal 'CLKDO_DQ'. In addition, the clock output section 130 can output a signal obtained by inverting the reset signal 'B' as the data strobe clock signal 'CLKDO_DQS'.

An exemplary method for outputting data in a semiconductor IC according to one embodiment will be described with reference to FIGS. 3-5.

Figure 5:
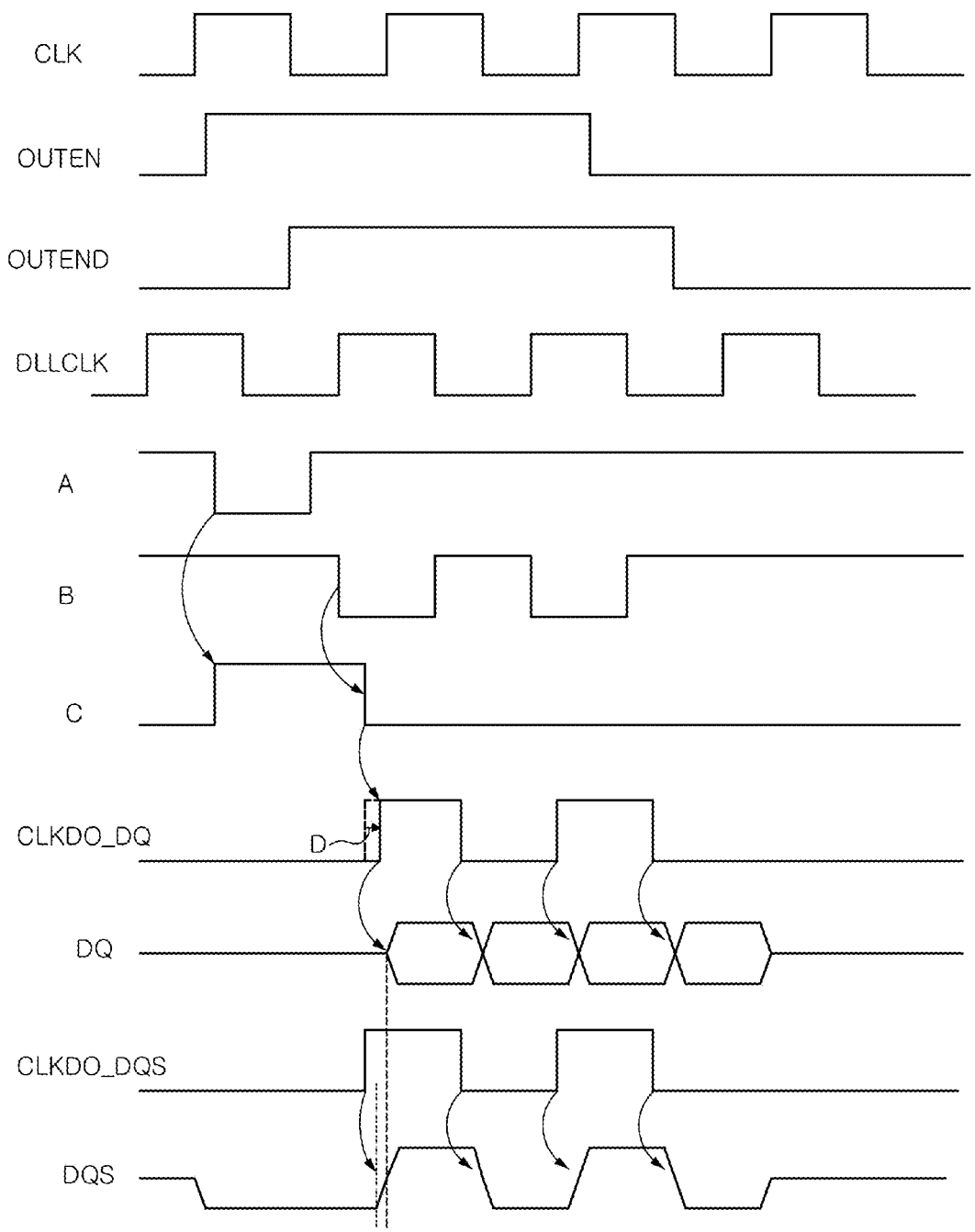
FIG. 5 is a timing diagram of the apparatus of FIG. 3 according to one embodiment.

FIG. 5 is a timing diagram illustrating the operation of the apparatus 50 of FIG. 3 according to one embodiment. In FIG. 5, the output enable signal 'OUTEN' can be activated for a predetermined interval. As the output enable signal 'OUTEN' transitions to a high level, the pulse generation unit 111 (in FIG. 4) can generate the set signal 'A' in the form of a low pulse having a pulse width corresponding to the delay time of the first delay element DLY1. Accordingly, the flip-flop 112 (in FIG. 4) can activate the control signal 'C' to a high level in response to the set signal 'A'.

Meanwhile, the reset signal generation section 120 can generate the reset signal 'B' by inverting the delay locked loop clock signal 'DLLCLK' during the activation interval of the delayed output enable signal 'OUTEND'. Accordingly, the flip-flop 112 can inactivate the control signal 'C' to a low level in response to the reset signal 'B'. Here, the inactivation of the control signal 'C' can be effected after the lapse of a predetermined delay time, compared to the generation of the reset signal 'B' because the reset signal 'B' can transition the level of the control signal 'C' after passing through the third NAND gate ND3 and the second NAND gate ND2 of the flip-flop 112. For example, the inactivation of the control signal 'C' can have a delay time 'D' corresponding to a signal processing time in the third NAND gate ND3 and the second NAND gate ND2.

Then, the clock output section 130 can invert the reset signal 'B' through the second inverter IV2, and can generate the data strobe clock signal 'CLKDO_DQS'. In addition, the clock output section 130 can generate the data clock signal 'CLKDO_DQ' in response to the inactivation of the control signal 'C' that is delayed by the delay time 'D' compared to the reset signal 'B'.

Next, the data output block 200 (in FIG. 3) can latch and drive the pre-data strobe signal 'PRE_DQS' in response to the data strobe clock signal 'CLKDO_DQS', and can output the data strobe signal 'DQS'. In addition, the data output block 200 can latch and drive the pre-data signal 'PRE_DQ' in response to the data clock signal 'CLKDO_DQ' after the lapse of the delay time 'D', and can output the data signal 'DQ'.

As described above, the data signal 'DQ' can initially start to transition from a termination level (VTT), whereas the data strobe signal 'DQS' can initially start to transition from a ground level (VSSQ). Accordingly, although the start levels of the data signal 'DQ' and the data strobe signal 'DQS' can be different from each other, by delaying an initial data clock signal 'CLKDO_DQ' by the delay time 'D' compared to an initial data strobe clock signal 'CLKDO_DQS', it is possible to make the transition timing of the data signal 'DQ' and the data strobe signal 'DQS' substantially the same. Of course, it is important to set the delay time 'D' such that a time difference when the data signal 'DQ' and the data strobe signal 'DQS' transition from the termination level (VTT) and the ground level (VSSQ) to a high level, respectively, can be compensated. Accordingly, the flip-flop 112 (in FIG. 4) can be adopted as an element capable of compensating for the time difference when the data signal 'DQ' and the data strobe signal 'DQS' are transited from the termination level (VTT) and the ground level (VSSQ) to a high level, respectively. Since the data signal 'DQ' after the initial data signal 'DQ' transitions from the ground level (VSSQ) or a power voltage level (VDDQ), it is not necessary to further delay the data clock signal 'CLKDO_DQ'.

Accordingly, the set signal 'A' can be generated only once during the activation interval of the output enable signal 'OUTEN', and, thereafter, the control signal 'C' does not participate in the generation of the data clock signal 'CLKDO_DQ'. Thus, the data clock signal 'CLKDO_DQ' after the initial data clock signal 'CLKDO_DQ' is generated with substantially the same timing as the data strobe clock signal 'CLKDO_DQS'. Finally, the data signal 'DQ' can be output in response to the data clock signal 'CLKDO_DQ' having substantially the same timing as the data strobe clock signal 'CLKDO_DQS'.

As a result, the apparatus and method for outputting data in a semiconductor IC can minimize a time difference between data and data strobe signals since they can be generated using clock signals having different timing. Accordingly, reliability of a semiconductor IC for outputting data output can be improved.

While certain embodiments have been described above, it will be understood that the embodiments described are by way of example only. Accordingly, the device and methods described herein should not be limited based on the described embodiments. Rather, the device and methods described herein should only be limited in light of the claims that follow when taken in conjunction with the above description and accompanying drawings.

What is claimed is:

1. An apparatus for outputting data in a semiconductor integrated circuit, comprising:
   a clock generation block configured to activate a first clock signal for outputting a data signal and a second clock signal for outputting a data strobe signal based on a predetermined timing according to a control signal, wherein the control signal is generated in response to an output enable signal, and an activation interval of the control signal is determined according to an amount of delay of a first delay element or a second delay element; and
   a data output block configured to latch a pre-data signal and a pre-data strobe signal in response to the first clock signal and the second clock signal, respectively and output the data signal and the data strobe signal, wherein
   the data signal and the data strobe signal are terminated at different voltage levels at activation start timing of the output enable signal, and
   the clock generation block further comprises:
      a control signal generation section configured to determine the activation interval of the control signal according to a set signal, generated in response to activation of the output enable signal, and a reset signal;
      a reset signal generation section configured to output a delay locked loop clock signal corresponding to an activation interval of the output enable signal, as the reset signal; and
      a clock output section configured to invert the reset signal and output the second clock signal, and to invert the reset signal in response to the control signal and output the first clock signal.

2. The apparatus according to claim 1, wherein the control signal generation section comprises:
   a pulse generation unit configured to generate the set signal in response to the activation of the output enable signal; and
   a flip-flop configured to generate the control signal in response to the set signal and the reset signal.

3. The apparatus according to claim 2, wherein the predetermined time difference is determined by the flip-flop.

4. An apparatus for outputting data in a semiconductor integrated circuit, comprising:
   a control signal generation section configured to determine an activation interval of a control signal according to a set signal and a reset signal, the set signal generated in response to activation of an output enable signal;
   a reset signal generation section configured to output a delay locked loop clock signal as the reset signal, the delay locked loop clock signal corresponding to an activation interval of the output enable signal;
   a clock output section configured to output a second clock signal by inverting the reset signal, and to output a first clock signal by inverting the reset signal in response to the control signal; and
   a plurality of latches configured to latch a pre-data signal in response to the first clock signal and the second clock signal, and to output a data signal and a data strobe signal having a predetermined time difference.

5. The apparatus according to claim 4, wherein the control signal generation section comprises:
   a pulse generation unit configured to generate the set signal in response to the activation of the output enable signal; and
   a flip-flop configured to generate the control signal in response to the set signal and the reset signal, wherein the predetermined time difference is determined by the flip-flop.

6. The apparatus according to claim 4, wherein the data signal and the data strobe signal are terminated at different voltage levels at activation start timing of the output enable signal.

7. The apparatus according to claim 4, wherein the data signal and the data strobe signal have substantially the same transition timing.

* * * * *